US006998964B2

(12) United States Patent
Lomax, Jr. et al.

(10) Patent No.: US 6,998,964 B2
(45) Date of Patent: Feb. 14, 2006

(54) SPLITTER

(75) Inventors: Charles Weston Lomax, Jr., Raleigh, NC (US); Clark Wayne Tollerson, Raleigh, NC (US); Randall L. Powers, Raleight, NC (US)

(73) Assignee: ADC DSL Systems, Inc., Eden Prairie, MN (US)

( * ) Notice: Subject to any disclaimer, the term of this patent is extended or adjusted under 35 U.S.C. 154(b) by 165 days.

(21) Appl. No.: 10/449,546

(22) Filed: May 30, 2003

(65) Prior Publication Data

US 2004/0239448 A1 Dec. 2, 2004

(51) Int. Cl.
*H04Q 1/00* (2006.01)

(52) U.S. Cl. .......................... 340/310.07; 340/310.01; 340/310.02; 340/310.06; 307/3; 307/89; 333/132

(58) Field of Classification Search ........... 340/310.07, 340/310.01, 310.02, 310.06; 307/3, 8, 89; 333/132; 398/171
See application file for complete search history.

(56) References Cited

U.S. PATENT DOCUMENTS

| | | | | |
|---|---|---|---|---|
| 3,717,858 A | | 2/1973 | Hadden | |
| 3,870,822 A | | 3/1975 | Matthews | |
| 3,968,333 A | | 7/1976 | Simokat et al. | |
| 4,639,714 A | | 1/1987 | Crowe | |
| 5,148,144 A | | 9/1992 | Sutterlin et al. | |
| 5,777,769 A | * | 7/1998 | Coutinho | 398/171 |
| 5,793,265 A | * | 8/1998 | Spielman | 333/132 |
| 5,818,127 A | * | 10/1998 | Abraham | 307/106 |
| 5,977,650 A | * | 11/1999 | Rickard et al. | 307/3 |
| 6,037,678 A | * | 3/2000 | Rickard | 307/89 |
| 6,329,906 B1 | | 12/2001 | Fisher et al. | |
| 6,580,254 B1 | | 6/2003 | Schofield | |

* cited by examiner

*Primary Examiner*—Davetta W. Goins
(74) *Attorney, Agent, or Firm*—Fogg and Associates, LLC; David N. Fogg

(57) ABSTRACT

A splitter for enabling a power signal and a communication signal to be transmitted over a common communication link is provided. The splitter includes a line port adapted to be coupled to a communication line, a power port adapted to be coupled to a power supply to receive a power signal, and a communication port adapted to be coupled to a communication circuit that generates and receives communication signals. The splitter also includes a low pass filter coupled between the power port and the line port, the low pass filter including a coupled inductor, a high pass filter coupled to the communication port, and wherein the communication signals and the power signal are transported on the communication line at the line port.

20 Claims, 3 Drawing Sheets

SPLITTER

BACKGROUND

Telecommunications networks transport signals between user equipment at diverse locations. A telecommunications network includes a number of components. For example, a telecommunications network typically includes a number of switching elements that provide selective routing of signals between network elements. Additionally, telecommunications networks include communication media, e.g., twisted pair, fiber optic cable, coaxial cable or the like that transport the signals between switches. Further, some telecommunications networks include access networks.

For purposes of this specification, the term "access network" means a portion of a telecommunication network, e.g., the public switched telephone network (PSTN), that allows subscriber equipment or devices to connect to a core network. For purposes of this specification, the term access network further includes customer located equipment (CLE) even if commonly considered part of an enterprise network. Examples of conventional access networks include a cable plant and equipment normally located in a central office or outside plant cabinets that directly provides service interface to subscribers in a service area. The access network provides the interface between the subscriber service end points and the communication network that provides the given service. An access network typically includes a number of network elements.

A network element is a facility or the equipment in the access-network that provides the service interfaces for the provisioned telecommunication services. A network element may be a stand-alone device or may be distributed among a number of devices. A network element is either central office located, outside plant located, or customer located equipment (CLE). Some network elements are hardened for outside plant environments. In some access networks as defined herein, various network elements may be owned by different entities. For example, the majority of the network elements in an access network may be owned by one of the Regional Bell Operating Companies (RBOCs) whereas the CLE may be owned by the subscriber. Such subscriber equipment is conventionally considered part of the subscriber's enterprise network, but, for purposes of this specification may be defined to part of the access network.

There are a number of conventional forms for access networks. For example, the digital loop carrier is an early form of access network. The conventional digital loop carrier transported signals to and from subscriber equipment using two network elements. At the core network side, a central office terminal is provided. The central office terminal is connected to the remote terminal over a high-speed digital link, e.g., a number of T1 lines or other appropriate high-speed digital transport medium. The remote terminal of the digital loop carrier typically connects to the subscriber over a conventional twisted pair drop.

The remote terminal of a digital loop carrier is often deployed deep in the customer service area. The remote terminal typically has line cards and other electronic circuits that need power to operate properly. In some applications, the remote terminal is powered locally. Unfortunately, to prevent failure of the remote terminal due to loss of local power, a local battery plant is typically used. This adds to the cost and complicates the maintainability of the remote terminal, due to the outside plant operational requirements which stipulate operation over extended temperature ranges.

In some networks, the remote terminal is fed power over a line from the central office. This is referred to as line feeding or line powering and can be accomplished through use of an AC or a DC source. Thus, if local power fails, the remote terminal still functions because it is typically powered over the line using a battery-backed power source. This allows the remote terminal to offer critical functions like lifeline plain old-fashioned telephone service (POTS) even during a power outage.

In a typical system offering line powering, the circuit that injects the power also is the source of the communication signals provided to the communication lines. The design of the power injection circuitry becomes complicated when the power signal is inserted in a different circuit from the circuit that terminates the communication signals. Therefore, there is a need in the art for improvements in the manner in which power is provided to network elements in an access network to allow injection of power signals onto a line carrying communication signals.

SUMMARY

Embodiments of the present invention address problems with providing power to network elements in an access network. Particularly, in one embodiment, a splitter for enabling a power signal and a communication signal to be transmitted over a common communication link is provided. The splitter includes a line port adapted to be coupled to a communication line, a power port adapted to be coupled to a power supply to receive a power signal, and a communication port adapted to be coupled to a communication circuit that generates and receives communication signals. The splitter also includes a low pass filter coupled between the power port and the line port, the low pass filter including a coupled inductor, a high pass filter coupled to the communication port, and wherein the communication signals and the power signal are transported on the communication line at the line port.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Figure 1:
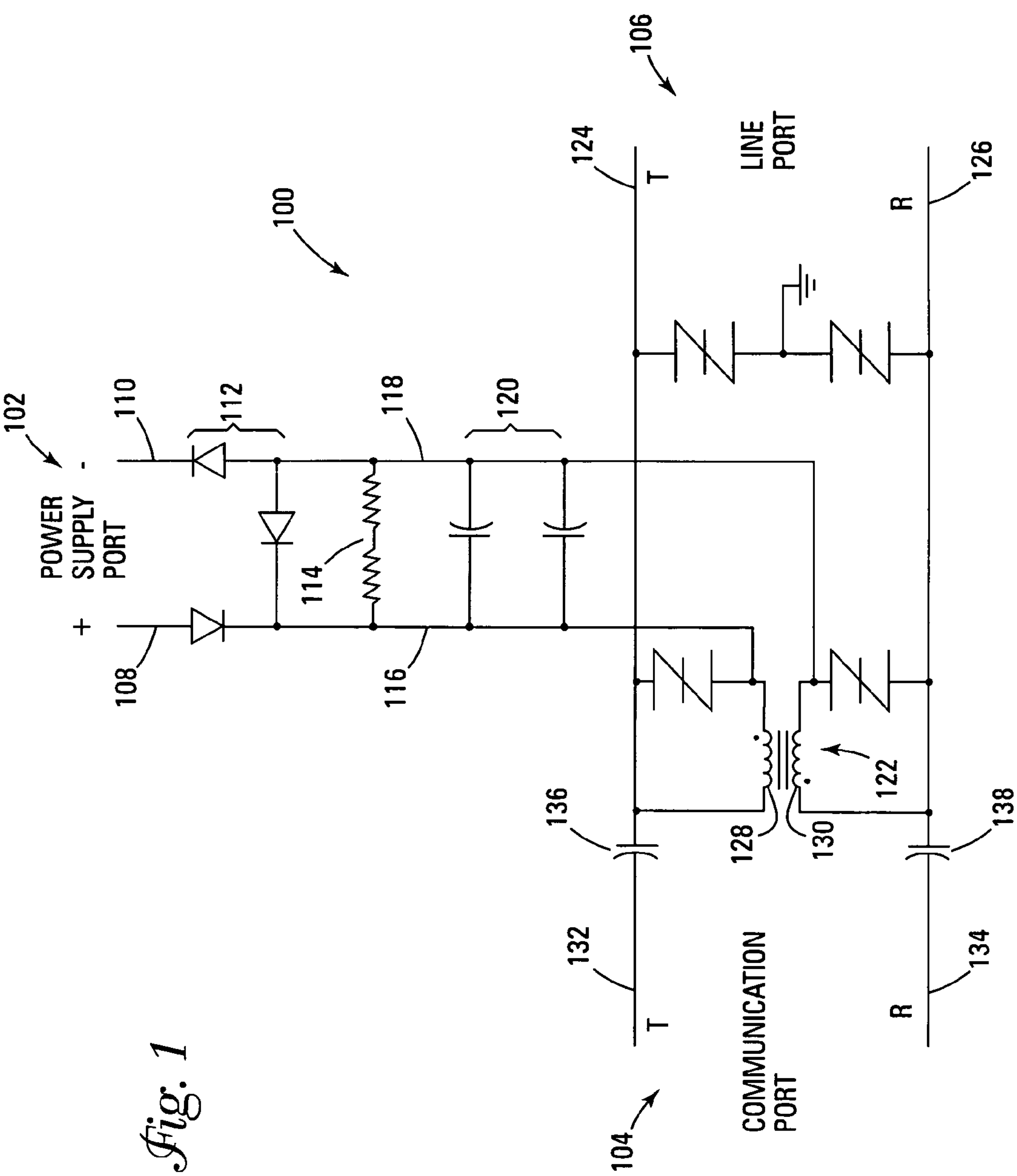
FIG. 1 is a schematic diagram of one embodiment of a splitter.

FIG. 1 is a schematic diagram of one embodiment of a splitter indicated generally at 100. Splitter 100 is configured to inject power signals into a communication line that contemporaneously carries communication signals between network elements without impairing effectiveness of the communication signals.

Splitter 100 includes three interface ports: power port 102, communication port 104, and line port 106. Power port 102 is adapted to be coupled to a power supply for providing line power to a line-powered network element. In one embodiment, power port 102 is coupled to a DC power supply. The DC power supply provides a power signal for powering a remote communication device such as a remote terminal in a digital loop carrier, a digital subscriber line (DSL) modem, an integrated access device, or other appropriate network element. Communication port 104 is adapted to be coupled to communication circuitry. For example, in one embodiment, communication port 104 is coupled to circuitry that transmits and receives xDSL signals, e.g., ADSL, G.SHDSL, VDSL, or communication signals generated according to any other appropriate communication standard. Line port 106 is adapted to couple to a communication line such as a twisted pair or other appropriate conductive medium.

Power port 102 is adapted to provide power signals for transmission on a communication line coupled to line port 106. In one embodiment, power port 102 includes first and second terminals 108 and 110. Terminals 108 and 110 are adapted to be coupled to positive and negative terminals of a power supply circuit (not shown). The power signal at terminal 108 is provided to line port 106 on tip (T) terminal 124. Similarly, the power signal at terminal 110 is provided to line port 106 on ring (R) terminal 126. The power signals provided to tip and ring terminals 124 and 126, respectively, are filtered to provide separation from communication signals passing over the same communication lines.

Splitter 100 includes a number of components coupled between power supply port 102 and line port 106 that provide this filtering function. These components include capacitors 120 and coupled inductor 122. The combination of the capacitors 120 and the inductors 122 provide low pass filtering for the power signals passing from terminal 108 to tip terminal 124 and from terminal 110 to ring terminal 126.

Capacitors 120 and coupled inductor 122 provide a high AC impedance and low DC impedance for the power signal from power port 102 to line port 106. Capacitors 120 are coupled in parallel between nodes 116 and 118. In one embodiment, coupled inductor 122 includes first and second windings 128 and 130 that are wrapped around a common core to provide first and second inductances. By using a common core, the two inductors are well matched. Further, by using a common core, a higher inductance is achieved for the low pass filter as compared to separate inductors of the same size.

Communication port 104 is coupled to line port 106 through a circuit with low AC impedance and high DC impedance (high pass filter). Communication port 104 includes tip (T) terminal 132 and ring (R) terminal 134. In one embodiment, tip terminal 132 is coupled through capacitor 136 to tip terminal 124 of line port 106. Similarly, ring terminal 134 is coupled through capacitor 138 to ring terminal 126. Capacitors 136 and 138 provide high DC impedance and low AC impedance.

Splitter 100 also includes a number of other components. Terminals 108 and 110 are also coupled to protection diodes 112. Protection diodes 112 are configured to protect the power supply by restricting the direction of current flow in splitter 100. Resistors 114 are also coupled between nodes 116 and 118 of splitter 100. Resistors 114 provide a discharge path for the high voltage capacitors of the power supply when it is unplugged, preventing a shock hazard after the card is removed from service. Splitter 100 also includes a number of overvoltage protection "crowbar" devices 140-1 to 140-4 to provide protection from voltage spikes such as spikes induced by lightning or the like.

In operation, splitter 100 injects power signals from power port 102 onto a communication line at line port 106 without substantial interference with the communication of communication signals between communication port 104 and line port 106. Capacitors 136 and 138 provide a high DC impedance and a low AC impedance so as to allow communication signals which may not be intended for line powered transport to be passed between communication port 104 and line port 106. Further, coupled inductor 122 and capacitors 120 provide a low DC impedance and a high AC impedance to allow power signals to be injected from power supply port 102 onto communication lines at line port 106 without corrupting the communication signals.

Figure 2:
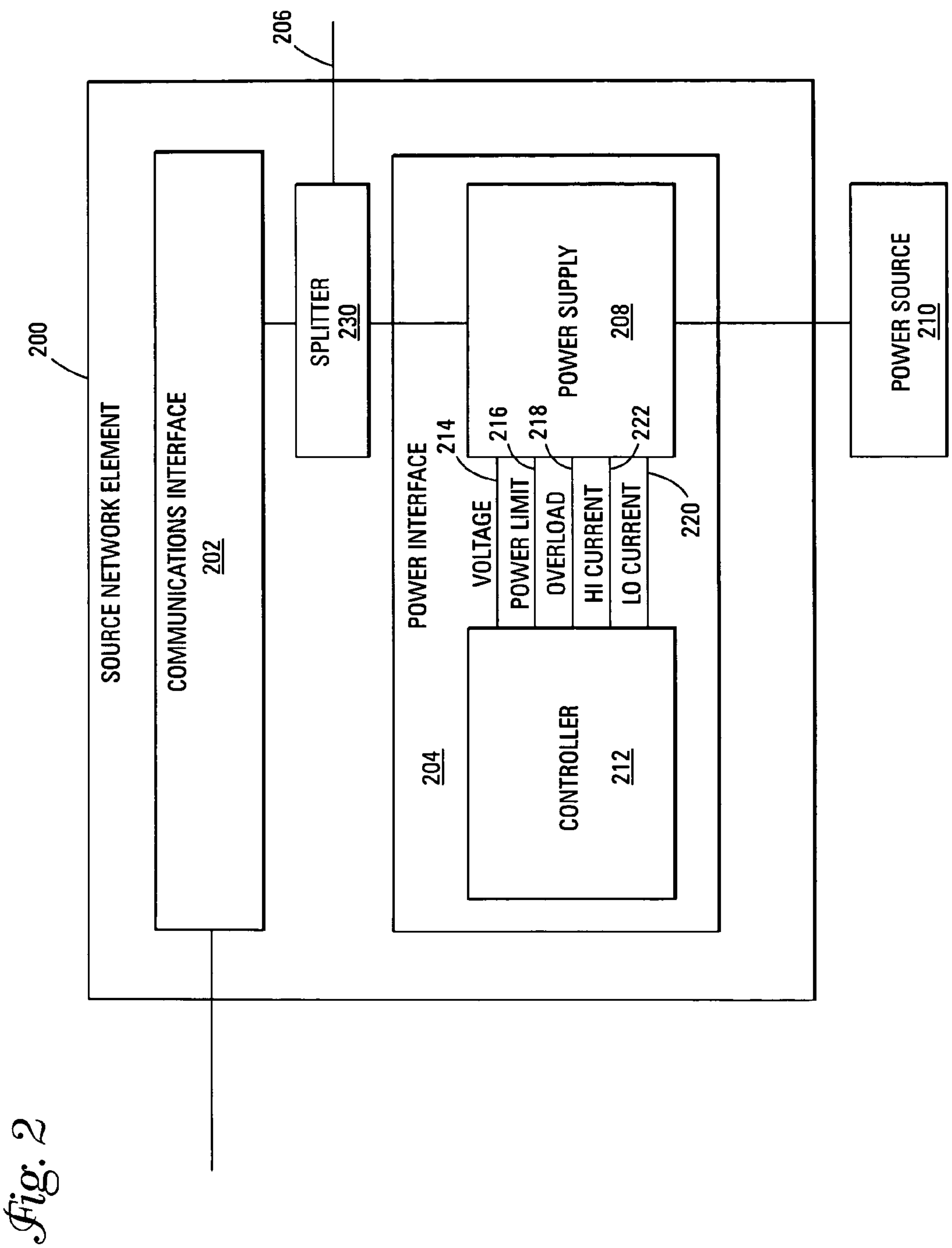
FIG. 2 is a block diagram of one embodiment of a network element of a communication network that is adapted to provide power to a subtended network element through using a splitter at the network element.

FIG. 2 is a block diagram of one embodiment of a network element 200 that provides line powering for one or more other network elements over one or more communication lines, e.g., twisted-pair telephone lines. The embodiment of a source network element 200 shown in FIG. 2 includes communication interface 202 and a power interface 204. The communication interface 202 includes appropriate components for providing the various telecommunications service provided by the source network element 200. For example, in the embodiment shown in FIG. 2, the communications interface 202 couples the source network element 200 to at least one upstream G.SHDSL communication link and to at least one downstream G.SHDSL communication link via a splitter 230. In one embodiment, splitter 230 is constructed as described above with respect to FIG. 1. The downstream G.SHDSL communication link is provided over at least one twisted-pair telephone line 206. In other embodiments, communication signals are generated according to any other appropriate communication standard. The twisted-pair telephone line 206 is coupled, in one embodiment to one or more network elements (referred to generally as "sink network element" and not shown in FIG. 2) that are powered by the source network element 200.

The power interface 204 includes a power supply 208 that is coupled to a power source 210. In general, the power supply 208 receives power from the power source 210 and conditions and supplies power on the twisted-pair telephone lines 206 in order to power a sink network element coupled to the twisted-pair telephone line 206. In one such embodiment, the power supply 208 is implemented as a fly-back power supply. The source network element 200 includes a splitter 230 that combines an output communication signal from the communications interface 202 and an output power signal from the power interface 204 and applies the combined output signal to the twisted-pair telephone line 206. The splitter 230 also receives an input signal from the twisted-pair telephone line 206 and splits off that portion of the received input signal used for providing the downstream communication link and provides it to the communications interface 202 for appropriate processing. One embodiment of a splitter 230 is described above with respect to FIG. 1.

The power interface 204 also includes a controller 212 that controls the operation of the power supply 208. In one such embodiment, controller 212 is implemented in hardware (for example, using analog and/or digital circuits) and/or in software (for example, by programming a programmable processor with appropriate instructions to carry out the various control functions described here). In other embodiments, the controller 212 is implemented in other ways. Although the controller 212 is shown as being a part of the power interface 204 in FIG. 2, in other embodiments the controller 212 is a part of a general controller or control circuitry for the central office terminal 200. In other embodiments, the functions performed by the controller 212 are incorporated directly into control circuitry of the power supply 208.

In the embodiment shown in FIG. 2, a voltage signal 214 is provided between the controller 212 and the power supply 208. The voltage signal 214 is used by the controller 212 to set a nominal voltage at which the power supply 208 is to supply power on the twisted-pair telephone line 206 in order to power a sink network element coupled to the twisted-pair telephone line 206. A power limit signal 216 is provided between the controller 212 and the power supply 208. The power limit signal 216 is used by the controller 212 to set a power limit for the power supply 208. The power limit is a maximum power the power supply 208 is to provide on the twisted-pair telephone line 206.

An overload signal 218 is provided by the power supply 208 to the controller 212. The overload signal 218 is used by the power supply 208 to inform the controller 212 that the power supply 208 is currently supplying power with an output voltage that is below the nominal voltage specified on the voltage signal 214. This is referred to here as an "overload condition" or that the power supply 208 is "out of regulation." For example, when a sink network element coupled to the twisted-pair telephone line 206 draws an amount of current that causes the amount of power supplied by the power supply 208 to exceed the power limit specified by the power limit signal 216, the power supply 208 drops the output voltage so that the total power supplied by the power supply 208 does not exceed the power limit. When an overload condition exists, the power supply 208 indicates that such an overload condition exists on the overload signal 218.

In the embodiment shown in FIG. 2, various current measurement signals are supplied by the power supply 208 to the controller 212. For example, a low current signal 220 is supplied by the power supply 208 to the controller 212 to indicate that the current currently supplied by the power supply 208 is below some relatively low threshold current value. A high current signal 222 is supplied by the power supply 208 to controller 212 to indicate that the current currently supplied by the power supply 208 is above some relatively high current value. In other embodiments, the amount of current currently supplied by the power supply 208 is measured and provided to the controller 212.

Figure 3:
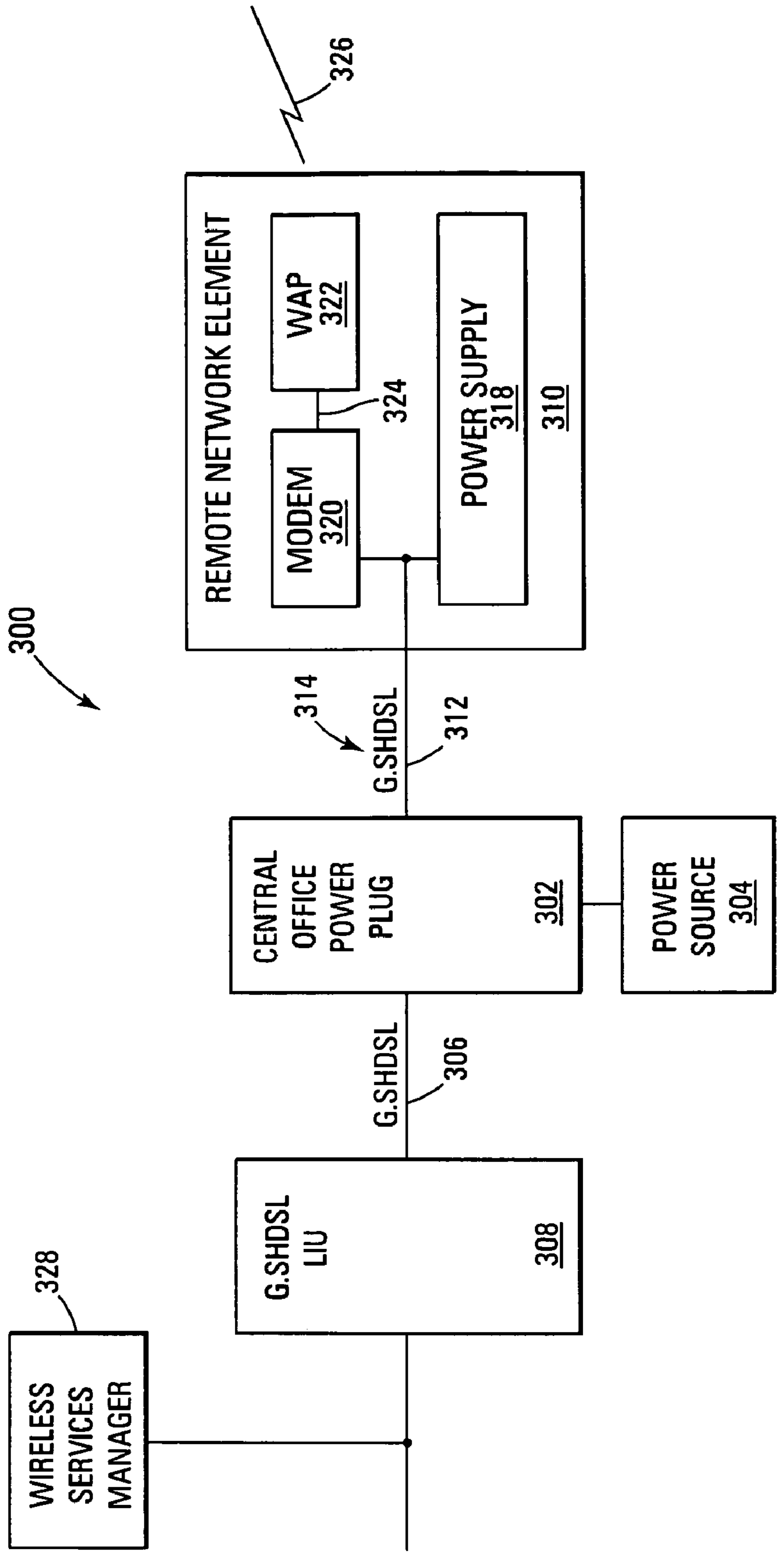
FIG. 3 is a block diagram of one embodiment of a communication system with a central office power plug that includes a splitter for combining power and communication signals for remotely powering a subtended network element.

FIG. 3 is a block diagram of one embodiment of a wireless network 300. The embodiment of a wireless network 300 shown in FIG. 3 includes a central office power plug 302 that is coupled to a power source 304. In one embodiment, central office power plug 302 is implemented using an embodiment of the source network element 200 described above. An upstream G.SHDSL communication link 306 is provided to the central office power plug 302 over an upstream communication medium (for example, a twisted-pair telephone line). The upstream G.SHDSL communication link 306 couples the central office power plug 302 to a G.SHDSL line interface unit 308. The G.SHDSL line interface unit 308 is coupled to an upstream network (not shown) such as the Internet. In one such embodiment, the G.SHDSL line interface units 308 is inserted into a subscriber access multiplexer (not shown) in order to couple the G.SHDSL line interface unit 308 to the upstream network.

The wireless network 300 also includes a remote network element 310. Remote network element 310 is powered by a twisted-pair telephone line 312 that is coupled between the central office power plug 302 and the remote network element 310. A downstream G.SHDSL communication link 314 is provided over the twisted-pair telephone line 312. The central office power plug 302 supplies power for the remote network element 310 on the twisted-pair telephone line 312 in the same manner as described above in connection with FIG. 2. The remote network element 310 includes a power supply 318 that is coupled to the twisted-pair telephone line 312. The power supply 318 extracts the power supplied on the twisted-pair telephone line 312 by the central office power plug 302. The extracted power is used to power various components of the remote network element 310.

The remote network element 310 also includes a G.SHDSL modem 320 that modulates and demodulates the G.SHDSL signals carried over the twisted-pair telephone line 312. The modem 320 is coupled to a wireless access point 322 over an Ethernet connection 324. The wireless access point 322 transmits traffic to, and receives traffic from various wireless devices (not shown) over a wireless link 326. Examples of wireless devices include computers or personal digital assistants having wireless transceivers. In one embodiment, the wireless access point 322 is a wireless access point that supports the Institute for Electrical and Electronic Engineers (IEEE) 802.11b standard (also referred to as "WI-FI"), 802.11a, HomeRF, or any other appropriate wireless communication standard. In other embodiments, the wireless access point 322 is replaced with circuitry for a wired local area network connection.

The wireless network 300 also includes a wireless services manager 328 that manages the wireless services provided over the wireless network 300. For example, in one embodiment, wireless services manager 328 manages authentication and other subscriber and service-related information using the Remote Authentication Dial-in User Service (RADIUS) protocol. In one embodiment, the wireless services manager 328 is coupled to the G.SHDSL line interface unit 308 using a local area network connection (for example, an Ethernet connection).

In operation, wireless traffic is received by the wireless access point 322 from various wireless devices. The wireless traffic is transmitted to the central office power plug 302 by the G.SHDSL modem 320 over the twisted-pair telephone line 312. A splitter (not shown in FIG. 3) splits off that portion of the signal used for providing the G.SHDSL communication link and provides it to a communications interface (not shown in FIG. 3) of the central office power plug 302 for appropriate processing. The communications interface transmits the traffic to the G.SHDSL line interface unit 308 over the upstream G.SHDSL communication link 306, where the traffic is processed and forwarded to the upstream network by the line interface unit 308. In the downstream direction, traffic is received by the G.SHDSL line interface unit 308 from the upstream network. The traffic is transmitted to the central office power plug 302 over the upstream communication link 306. The traffic is combined with power from a power supply (not shown in FIG. 3) of the central office power plug 302 by the splitter and the combined signal is transmitted on the twisted-pair telephone line 312. The signal is received by the G.SHDSL modem 320, which forwards the traffic to the wireless access point 322 for transmission to the wireless devices.

What is claimed is:

1. A splitter for enabling a power signal and a communication signal to be transmitted over a common communication link, the splitter comprising:

a line port adapted to be coupled to a communication line;

a power port adapted to be coupled to a power supply to receive a power signal;

a communication port adapted to be coupled to a communication circuit that generates and receives communication signals;

a low pass filter coupled between the power port and the line port, the low pass filter including a coupled inductor;

a high pass filter coupled to the communication port;

wherein the communication signals and the power signal are transported on the communication line at the line port.

2. The splitter of claim 1, wherein the coupled inductor includes:

a first winding;

a second winding;

a common core; and wherein the first winding is coupled to a first terminal of the power port and the second winding is coupled to a second terminal of the power port.

3. The splitter of claim 1, wherein the low pass filter further includes at least one capacitor coupled between first and second ports of the power port.

4. The splitter of claim 1, wherein the high pass filter includes a pair of capacitors coupled to first and second terminals of the communication port.

5. A circuit for injecting power onto a line carrying a communication signal, the circuit comprising:

means for receiving a communication signal;

means for receiving a power signal;

means for providing a high DC impedance and low AC impedance for the communication signal to produce a conditioned communication signal coupled to the means for receiving the communication signal;

coupled inductor means for providing a high AC impedance and a low DC impedance for the power signal to produce a conditioned power signal coupled to the means for receiving the power signal; and means for combining the conditioned communication signal with the conditioned power signal.

6. The circuit of claim 5, wherein the means for receiving a power signal includes first and second terminals.

7. The circuit of claim 5, wherein the means for providing a high DC impedance and low AC impedance comprises a pair of capacitors coupled to first and second input terminals of the means for receiving a communication signal.

8. The circuit of claim 5, wherein the coupled inductor means for providing a high AC impedance and a low DC impedance comprises:

an inductor with a first winding, a second winding and a common core; and at least one capacitor coupled across one end of the first and second windings.

9. A source network element, comprising:

a communication interface, adapted to be coupled to a communication link;

a power interface including a power supply adapted to receive a power signal from a power source;

a splitter, coupled to the communication interface and the power interface, the splitter comprising:

a line port adapted to be coupled to a communication line;

a power port adapted to be coupled to the power interface to receive a power signal;

a communication port adapted to be coupled to the communication interface that transmits and receives communication signals;

a low pass filter coupled between the power port and the line port, the low pass filter including a coupled inductor;

a high pass filter coupled to the communication port;

wherein the communication signals and the power signal are transported on the communication line at the line port.

10. The source network element of claim 9, wherein the coupled inductor includes:

a first winding;

a second winding;

a common core; and wherein the first winding is coupled to a first terminal of the power port and the second winding is coupled to a second terminal of the power port.

11. The source network element of claim 9, wherein the low pass filter further includes at least one capacitor coupled between first and second ports of the power port.

12. The source network element of claim 9, wherein the high pass filter includes a pair of capacitors coupled to first and second terminals of the communication port.

13. A method for injecting a power signal onto a communication line, the method comprising:

receiving a communication signal;

receiving a power signal;

providing a high DC impedance and low AC impedance for the communication signal to produce a conditioned communication signal;

providing a high AC impedance and a low DC impedance for the power signal using a coupled inductor to produce a conditioned power signal; and transmitting the conditioned power signal on the same communication lines with the conditioned communication signal.

14. The method of claim 13, wherein receiving a communication signal comprises receiving upstream and downstream communication signals.

15. The method of claim 13, wherein receiving a power signal comprises receiving a signal from a DC power source.

16. A wireless system, comprising:

a communication circuit that transmits and receives communication signals according to a selected protocol;

a remote network element, the remote network element including a modem adapted to transmit and receive signals according to the selected protocol;

the remote terminal further including a wireless access point, coupled to the modem, the wireless access point adapted to provide a wireless interface to the system;

a central office power plug, coupled to the communication circuit and the remote network element, the central office power plug including a splitter, the splitter including:

a line port adapted to be coupled to remote terminal over a communication line;

a power port adapted to receive a power signal;

a communication port coupled to the communication circuit;

a low pass filter coupled between the power port and the line port, the low pass filter including a coupled inductor;

a high pass filter coupled to the communication port;

wherein the communication signals and the power signal are transported on the communication line at the line port.

17. The system of claim 16, wherein the coupled inductor includes:

a first winding;

a second winding;

a common core; and wherein the first winding is coupled to a first terminal of the power port and the second winding is coupled to a second terminal of the power port.

18. The system of claim 16, wherein the low pass filter further includes at least one capacitor coupled between first and second ports of the power port.

19. The system of claim 16, wherein the high pass filter includes a pair of capacitors coupled to first and second terminals of the communication port.

20. A splitter comprising:

a power port including first and second terminal;

a line port including first and second terminals;

a communication port including first and second terminals;

a coupled inductor having first and second windings;

the first winding coupled between the first terminal of the power port and the first terminal of the line port;

the second winding coupled between the second terminal of the power port and the second terminal of the line port;

a capacitor coupled across the first and second windings of the coupled inductor, the capacitor and the coupled inductor providing a high AC impedance for a power signal received at the power port; and first and second capacitors coupled to the first and second terminals, respectively, of the communication port, so as to provide a high DC impedance for a communication signal transmitted to or from the communication port so as to enable transmission of the power signal and the communication signals on a common communication line at the line port.

* * * * *